US011424738B2

(12) United States Patent
Habu et al.

(10) Patent No.: US 11,424,738 B2
(45) Date of Patent: Aug. 23, 2022

(54) DRIVING CIRCUIT

(71) Applicant: Mitsubishi Electric Corporation, Tokyo (JP)

(72) Inventors: Yo Habu, Tokyo (JP); Akihisa Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/411,648

(22) Filed: Aug. 25, 2021

(65) Prior Publication Data

US 2022/0173733 A1    Jun. 2, 2022

(30) Foreign Application Priority Data

Nov. 30, 2020    (JP) .............................. JP2020-198180

(51) Int. Cl.
*H03K 17/567*    (2006.01)
(52) U.S. Cl.
CPC ................. *H03K 17/567* (2013.01)
(58) Field of Classification Search
CPC ..................................... H03K 17/567

USPC ......................................................... 327/109
See application file for complete search history.

(56) References Cited

U.S. PATENT DOCUMENTS

2014/0055190 A1* 2/2014 Kaneko ................ H03K 17/168
327/376
2017/0302152 A1* 10/2017 Watanabe ............. H02M 1/088

FOREIGN PATENT DOCUMENTS

JP        2016-181973 A    10/2016

\* cited by examiner

*Primary Examiner* — Metasebia T Retebo
(74) *Attorney, Agent, or Firm* — Studebaker & Brackett PC

(57) ABSTRACT

The object is to provide a technology enabling appropriate driving of an IGBT. A driving circuit is a driving circuit that drives an IGBT by controlling the gate voltage of the IGBT, and includes a first charging capability and a second charging capability. The first charging capability increases the gate voltage up to a threshold voltage of the IGBT, and a second charging capability increases the gate voltage beyond the threshold voltage. An increase in the gate voltage with the first charging capability per unit time is higher than an increase in the gate voltage with the second charging capability per unit time.

5 Claims, 5 Drawing Sheets

F I G. 3
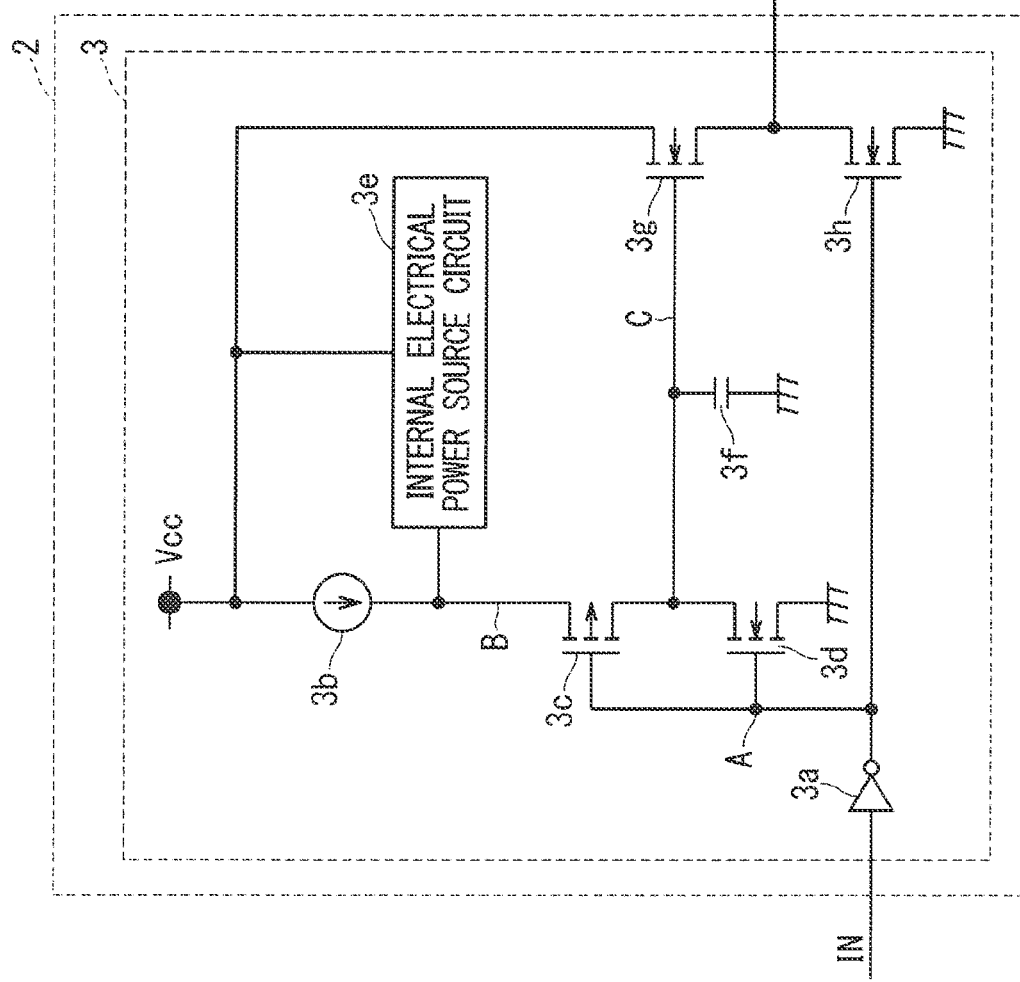

F I G. 5
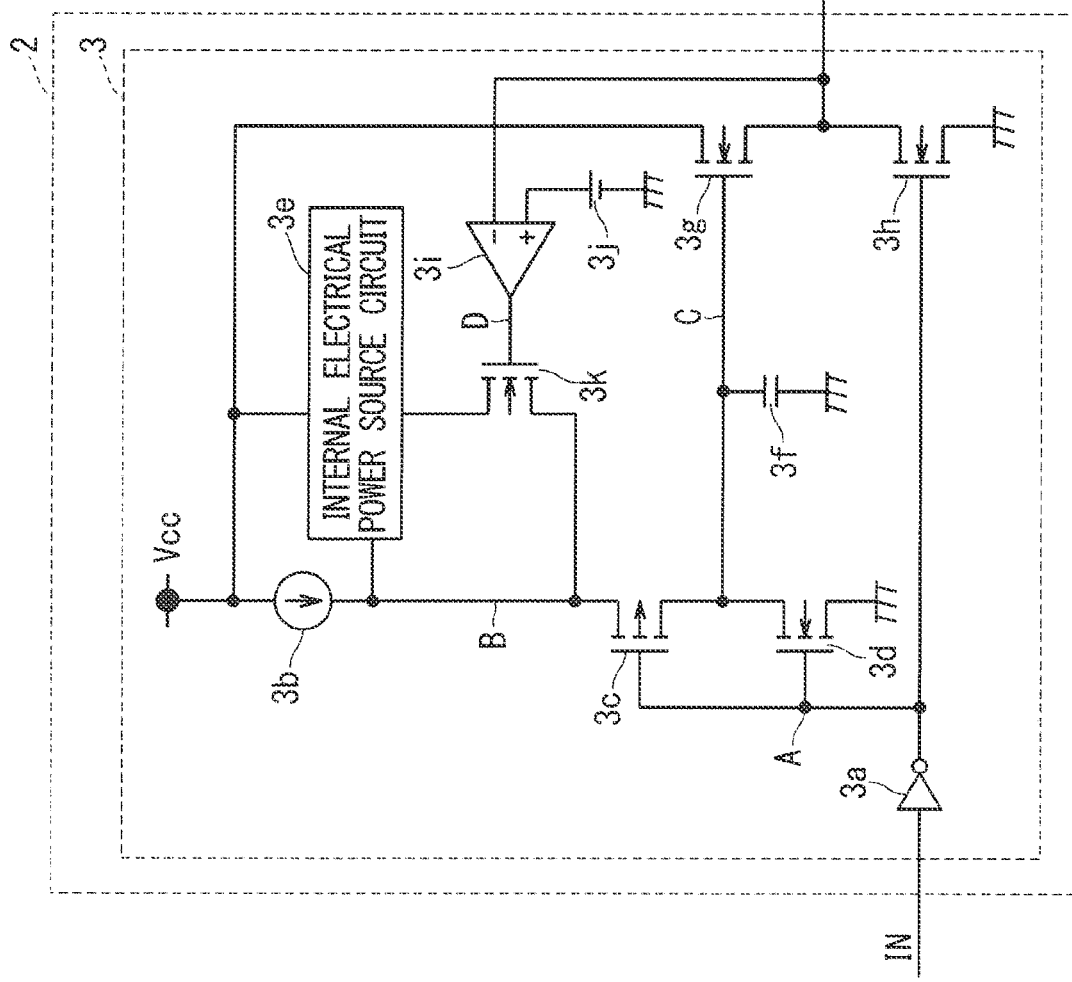

DRIVING CIRCUIT

BACKGROUND OF THE INVENTION

Field of the Invention

The present disclosure relates to a driving circuit.

Description of the Background Art

Various technologies on a driving circuit that drives an insulated gate bipolar transistor (IGBT) by controlling a gate voltage of the IGBT have been proposed. For example, Japanese Patent Application Laid-Open No. 2016-181973 proposes a technology for not suddenly but gradually increasing the gate voltage.

However, gradually increasing the gate voltage from the beginning to the end of turning on the IGBT causes a problem of prolonging the turn-on time.

SUMMARY

The present disclosure has been conceived in view of the problem, and has an object of providing a technology enabling appropriate driving of the IGBT.

A driving circuit according to the present disclosure is a driving circuit that drives an IGBT by controlling a gate voltage of the IGBT, and includes a first charging capability of increasing the gate voltage up to a threshold voltage of the IGBT, and a second charging capability of increasing the gate voltage beyond the threshold voltage, wherein an increase in the gate voltage with the first charging capability per unit time is higher than an increase in the gate voltage with the second charging capability per unit time.

This enables appropriate driving of the IGBT.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 illustrates a structure of a semiconductor device according to Embodiment 2;

FIG. 5 illustrates a structure of a semiconductor device according to Embodiment 3.

DESCRIPTION OF THE PREFERRED EMBODIMENTS

Figure 1:
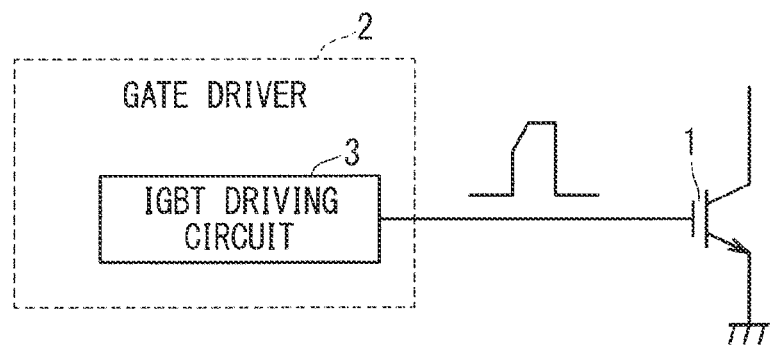
FIG. 1 illustrates a structure of a semiconductor device according to Embodiment 1.

Hereinafter, Embodiments will be described with reference to the accompanying drawings. The features to be described in Embodiments below are mere exemplification, and all of the features are not necessarily essential. In the description below, identical constituent elements in a plurality of Embodiments will be denoted by the same or similar reference numerals, and the different constituent elements will be mainly described.

Embodiment 1

FIG. 1 illustrates a structure of a semiconductor device according to Embodiment 1. The semiconductor device in FIG. 1 includes an insulated gate bipolar transistor (IGBT) 1 and a gate driver 2. The IGBT 1 and the gate driver 2 may be made of normal silicon (Si), or a wide bandgap semiconductor such as silicon carbide (SiC), gallium nitride (GaN), or diamond. When the IGBT 1 and the gate driver 2 are made of a wide bandgap semiconductor, stable operations at high temperatures and at high voltages and faster switching are possible.

The IGBT 1 is included in, for example, an inverter (not illustrated) that can change a frequency of a current. A steep rise in a gate voltage of the IGBT 1 delays a decrease in a voltage $V_{CE}$ between a collector and an emitter of the IGBT 1 (hereinafter may be simply referred to as "$V_{CE}$").

The gate driver 2 is, for example, an integrated circuit (IC). The gate driver 2 includes an IGBT driving circuit 3. The IGBT driving circuit 3 is a driving circuit that drives the IGBT 1 by controlling the gate voltage of the IGBT 1.

Figure 2:
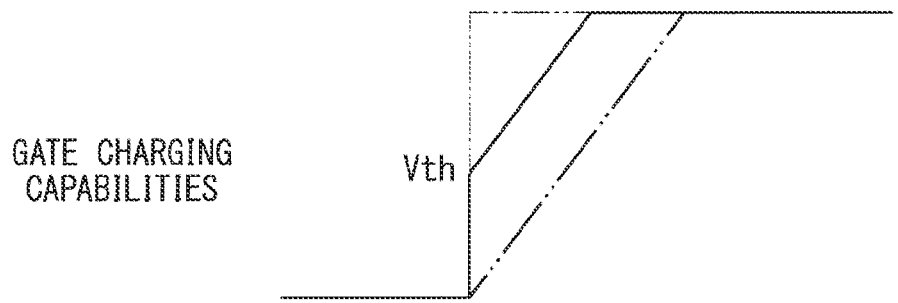
FIG. 2 illustrates operations of an IGBT driving circuit according to Embodiment 1.
Figure 2:
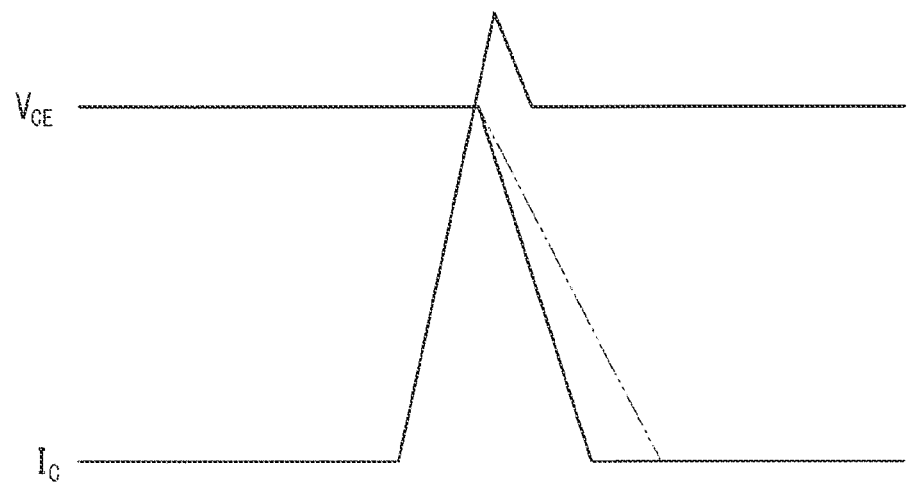

FIG. 2 illustrates operations of the IGBT driving circuit 3 according to Embodiment 1 when the IGBT 1 is turned on. FIG. 2 illustrates waveforms of gate charging capabilities (current) of the IGBT driving circuit 3 for charging a gate of the IGBT 1, the voltage $V_{CE}$ between the collector and the emitter of the IGBT 1, and a collector current $I_C$ of the IGBT 1 (hereinafter may be simply referred to as "$I_C$"). The gate charging capabilities substantially correspond to the gate voltage of the IGBT 1.

The IGBT driving circuit 3 includes a first charging capability of increasing the gate voltage of the IGBT 1 up to a threshold voltage Vth of the IGBT 1 (hereinafter may be simply referred to as "Vth"), and a second charging capability of increasing the gate voltage of the IGBT 1 beyond the threshold voltage Vth. As illustrated in FIG. 2, an increase in the gate voltage with the first charging capability per unit time is higher than that with the second charging capability per unit time. Although FIG. 2 illustrates the increases in the first charging capability and the second charging capability using straight lines, the increases may be indicated not necessarily by the straight lines but by, for example, curves as long as the aforementioned relationship holds.

Here, a steep rise in the gate voltage from the beginning to the end of turning on the IGBT 1 as illustrated by a thin chain double-dashed line of the gate charging capabilities in FIG. 2 delays a decrease in $V_{CE}$ as illustrated by a thin chain double-dashed line of $V_{CE}$ in FIG. 2, and the turn-on loss relatively increases.

Furthermore, a gradual rise in the gate voltage from the beginning to the end of turning on the IGBT 1 as illustrated by a thick chain double-dashed line of the gate charging capabilities accelerates the decrease in $V_{CE}$ as illustrated by a solid line of $V_{CE}$ in FIG. 2, but prolongs the turn-on time.

In contrast, in the semiconductor device according to Embodiment 1, the gate voltage steeply rises until the gate voltage exceeds Vth. After the gate voltage exceeds Vth, the gate voltage gradually rises by a ramp drive. This can accelerate the decrease in $V_{CE}$ and reduce the turn-on time. Consequently, for example, the dead time of the inverter including the IGBT 1 can be reduced.

A structure for gradually increasing the gate voltage until the gate voltage exceeds Vth and steeply increasing the gate voltage after the gate voltage exceeds Vth is conceivable as a structure for performing operations in reverse to those of the semiconductor device according to Embodiment 1.

However, the semiconductor device according to Embodiment 1 can accelerate the decrease in $V_{CE}$ more than this structure. Thus, the IGBT 1 can be appropriately driven in consideration of $V_{CE}$ and the turn-on time according to Embodiment 1.

Embodiment 2

FIG. 3 illustrates a structure of a semiconductor device according to Embodiment 2. Hereinafter, constituent elements according to Embodiment 2 identical or similar to those described in Embodiment 1 will be denoted by the same or similar reference numerals, and the different constituent elements will be mainly described. A p-type metal oxide semiconductor field effect transistor (p-type MOSFET) will be abbreviated as a "PMOS", and an n-type MOSFET will be abbreviated as an "NMOS" in the description below.

In the example of FIG. 3, the IGBT driving circuit 3 includes an inverter 3a that is a NOT gate, a constant current circuit 3b, a PMOS 3c that is a first transistor, and an NMOS 3d that is a second transistor. The IGBT driving circuit 3 also includes an internal electrical power source circuit 3e, a capacitor 3f, an NMOS 3g that is a third transistor, and an NMOS 3h that is a fourth transistor.

The inverter 3a outputs a low signal when an input signal IN is high, and outputs a high signal when the input signal IN is low.

The constant current circuit 3b has a first terminal connected to a power source Vcc, and a second terminal connected to a first terminal of the PMOS 3c. The PMOS 3c has a second terminal connected to a first terminal of the NMOS 3d. The NMOS 3d has a second terminal that is grounded. The gates of the PMOS 3c and the NMOS 3d are connected to the output of the inverter 3a.

The internal electrical power source circuit 3e is connected in parallel with the constant current circuit 3b. Although the internal electrical power source circuit 3e has a source function of supplying a current to a point B, it does not have a sink function of drawing a current from the point B.

The capacitor 3f has a first terminal connected to a connecting point connected to the PMOS 3c and the NMOS 3d, and a second terminal that is grounded.

The NMOS 3g has a first terminal connected to the first terminal of the constant current circuit 3b, and a second terminal connected to a first terminal of the NMOS 3h. The NMOS 3h has a second terminal that is grounded. The NMOS 3g has a gate connected to the connecting point of the PMOS 3c and the NMOS 3d and connected to the first terminal of the capacitor 3f. The NMOS 3h has a gate connected to the output of the inverter 3a.

A signal at a connecting point of the NMOSs 3g and 3h is used as an output signal OUT of the IGBT driving circuit 3. The output signal OUT defines the first charging capability and the second charging capability described in Embodiment 1.

In the IGBT driving circuit 3, a pair of the PMOS 3c and the NMOS 3d outputs an intermediate signal (a voltage at a point C in FIG. 3) generated by the internal electrical power source circuit 3e, the constant current circuit 3b, and the capacitor 3f based on the output of the inverter 3a corresponding to the input signal IN. A pair of the NMOS 3g and the NMOS 3h outputs the output signal OUT, based on the intermediate signal and the output of the inverter 3a corresponding to the input signal IN. Furthermore, an increase in the intermediate signal by the internal electrical power source circuit 3e per unit time is higher than and ends earlier than that by the constant current circuit 3b and the capacitor 3f per unit time, which will be described in detail later.

A buffer circuit 4 is inserted between the IGBT 1 and the IGBT driving circuit 3. The buffer circuit 4 charges the gate of the IGBT 1 based on the output signal OUT. When the NMOS 3g and the NMOS 3h have sufficient charging capability (current), the buffer circuit 4 is unnecessary.

Figure 4:
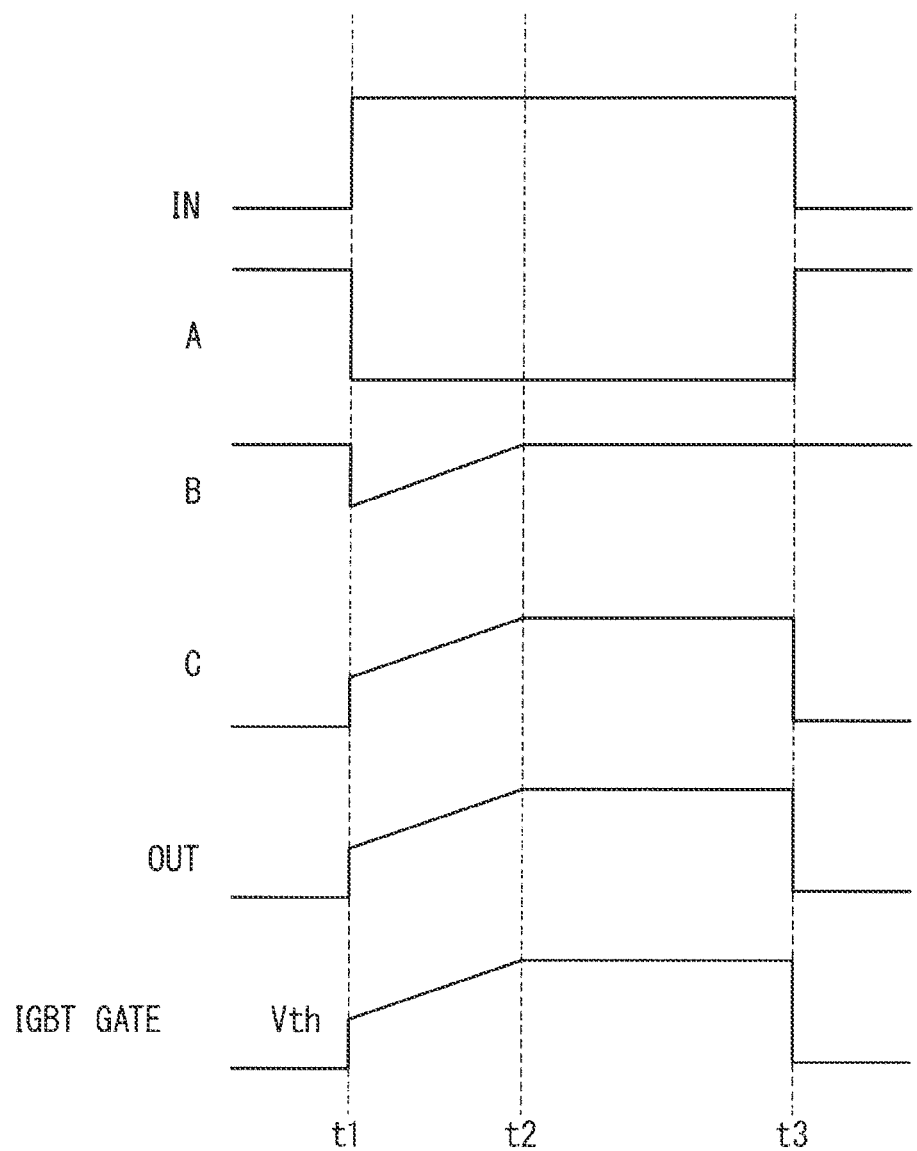
FIG. 4 illustrates operations of an IGBT driving circuit according to Embodiment 2.

FIG. 4 illustrates operations of the IGBT driving circuit 3 according to Embodiment 2.

When the input signal IN is switched from a low state to a high state at a time t1, the voltage at a point A in FIG. 3 is low, the PMOS 3c is turned on, and the NMOS 3d and the NMOS 3h are turned off. Consequently, the output voltage of the internal electrical power source circuit 3e increases the intermediate signal (voltage at the point C in FIG. 3) to be fed into the NMOS 3g, and turns on the NMOS 3g. Since the output voltage of the internal electrical power source circuit 3e steeply increases the intermediate signal, the output signal OUT steeply rises, and the gate voltage of the IGBT 1 steeply rises up to Vth.

The point C in FIG. 3 is charged between the time t1 and a time t2 at a speed determined by the constant current from the constant current circuit 3b and the capacitance of the capacitor 3f. The intermediate signal has a ramp waveform indicating a gradual increase. Consequently, the output signal OUT and the gate voltage of the IGBT 1 also have the ramp waveforms. After the time t2, the intermediate signal, the output signal OUT, and the gate voltage of the IGBT 1 are high.

When the input signal IN is switched from the high state to the low state at a time t3, the voltage at the point A in FIG. 3 is high, the PMOS 3c is turned off and the NMOS 3d and the NMOS 3h are turned on. Accordingly, the NMOS 3g is turned off, and the intermediate signal, the output signal OUT, and the gate voltage of the IGBT 1 are low.

Embodiment 2 can achieve the IGBT driving circuit 3 including the first charging capability and the second charging capability described in Embodiment 1.

Embodiment 3

FIG. 5 illustrates a structure of a semiconductor device according to Embodiment 3. Hereinafter, constituent elements according to Embodiment 3 identical or similar to those described in Embodiments 1 and 2 will be denoted by the same or similar reference numerals, and the different constituent elements will be mainly described.

In Embodiment 2, adjusting, to the threshold voltage Vth, the voltage when the first charging capability is switched to the second charging capability is slightly difficult. In contrast, Embodiment 3 enables the IGBT driving circuit 3 to switch from the first charging capability to the second charging capability easily and accurately, which will be described below.

The IGBT driving circuit 3 in FIG. 5 additionally includes a comparator 3i, a comparison voltage 3j, and an NMOS 3k in the IGBT driving circuit 3 in FIG. 3.

The comparator 3i has an inverted input terminal (−) connected to the output of the IGBT driving circuit 3, and a non-inverted input terminal (+) connected to the comparison voltage 3j. The comparison voltage 3j corresponds to the threshold voltage Vth of the IGBT 1. The NMOS 3k has a terminal connected to the output of the internal electrical power source circuit 3e, and another terminal connected to a connecting point connected to the constant current circuit 3b and the PMOS 3c. The NMOS 3k has a gate connected to the output of the comparator 3*i*. With the aforementioned structure, the comparator 3*i* is configured to control the output of the internal electrical power source circuit 3*e*, based on a result of the comparison between the output signal OUT of the IGBT driving circuit 3 and the comparison voltage 3*j*.

Figure 6:
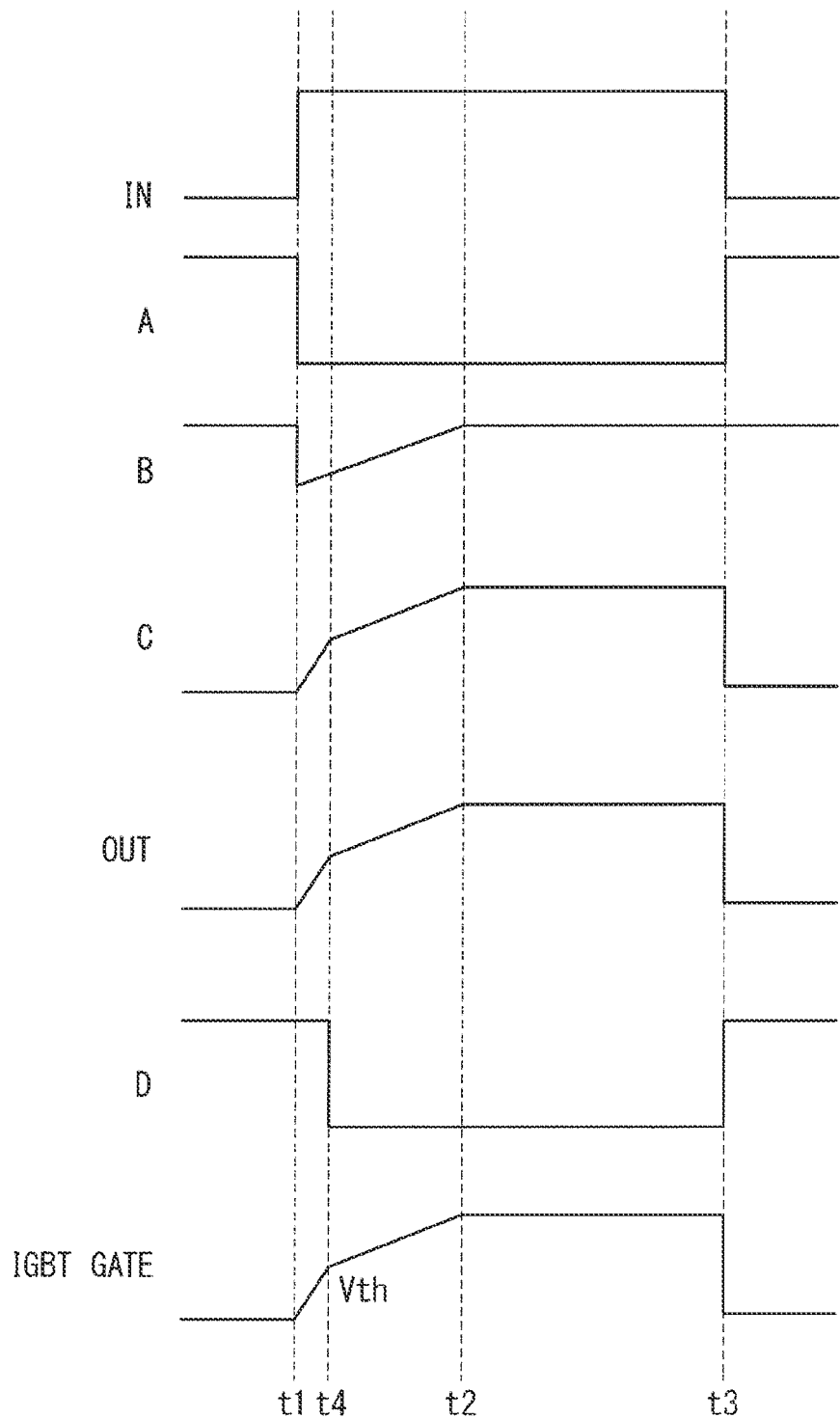
FIG. 6 illustrates operations of an IGBT driving circuit according to Embodiment 3.

FIG. 6 illustrates operations of the IGBT driving circuit 3 according to Embodiment 3. The operations at the time t1, t2, and t3 in FIG. 6 are identical to the operations at the time t1, t2, and t3 in FIG. 4, respectively.

At a time t4 when the output signal OUT indicates a voltage corresponding to the threshold voltage Vth of the IGBT 1, that is, the comparison voltage 3*j*, the comparator 3*i* turns off the NMOS 3*k*. Consequently, the intermediate signal, the output signal OUT, and the gate voltage of the IGBT 1 after the time t4 have the ramp waveforms.

Since the comparator 3*i* controls the output of the internal electrical power source circuit 3*e*, based on the output signal OUT of the IGBT driving circuit 3, Embodiment 3 enables the IGBT driving circuit 3 to switch from the first charging capability to the second charging capability easily and accurately.

Embodiments and the modifications can be freely combined, and appropriately modified or omitted.

What is claimed is:

1. A driving circuit that drives an IGBT by controlling a gate voltage of the IGBT, the driving circuit comprising:
    a first charging capability of increasing the gate voltage up to a threshold voltage of the IGBT, and a second charging capability of increasing the gate voltage beyond the threshold voltage, wherein
    an increase in the gate voltage with the first charging capability per unit time is higher than an increase in the gate voltage with the second charging capability per unit time such that a rate of change of the gate voltage changes sharply at the threshold voltage.

2. The driving circuit according to claim 1, wherein the IGBT is included in an inverter.

3. A driving circuit that drives an IGBT by controlling a gate voltage of the IGBT, the driving circuit comprising:
    a first charging capability of increasing the gate voltage up to a threshold voltage of the IGBT, and a second charging capability of increasing the gate voltage beyond the threshold voltage;
    an internal electrical power source circuit;
    a constant current circuit;
    a capacitor;
    a pair of a first transistor and a second transistor, the pair outputting an intermediate signal generated by the internal electrical power source circuit, the constant current circuit, and the capacitor based on an input signal; and
    a pair of a third transistor and a fourth transistor, the pair outputting an output signal defining the first charging capability and the second charging capability, based on the input signal and the intermediate signal, wherein
    an increase in the gate voltage with the first charging capability per unit time is higher than an increase in the gate voltage with the second charging capability per unit time, and
    an increase in the intermediate signal by the internal electrical power source circuit per unit time is higher than and ends earlier than an increase in the intermediate signal by the constant current circuit and the capacitor per unit time.

4. The driving circuit according to claim 3, further comprising
    a comparator controlling an output of the internal electrical power source circuit based on the output signal.

5. A driving circuit that drives an IGBT by controlling a gate voltage of the IGBT, the driving circuit comprising:
    a first charging capability of increasing the gate voltage up to a threshold voltage of the IGBT, and a second charging capability of increasing the gate voltage beyond the threshold voltage;
    a constant current circuit;
    a capacitor; and
    a transistor, wherein
    an increase in the gate voltage with the first charging capability per unit time is higher than an increase in the gate voltage with the second charging capability per unit time, and
    the increase in the gate voltage with the second charging capability gradually increases based on a gradual increase in voltage provided to the transistor from the constant current circuit and the capacitor.

* * * * *